(12) United States Patent
Seki et al.

(10) Patent No.: US 7,491,106 B2
(45) Date of Patent: Feb. 17, 2009

(54) METHOD OF MANUFACTURING EL PANEL INCLUDING TWO CURING STEPS

(75) Inventors: Junichi Seki, Tokyo (JP); Yukihiro Azuma, Tokyo (JP)

(73) Assignee: TDK Corporation, Tokyo (JP)

( * ) Notice: Subject to any disclaimer, the term of this patent is extended or adjusted under 35 U.S.C. 154(b) by 437 days.

(21) Appl. No.: 11/341,462

(22) Filed: Jan. 30, 2006

(65) Prior Publication Data

US 2006/0178073 A1    Aug. 10, 2006

(30) Foreign Application Priority Data

Jan. 31, 2005    (JP) .......................... P2005-024617

(51) Int. Cl.
*H01J 9/00* (2006.01)
(52) U.S. Cl. ....................................... 445/25
(58) Field of Classification Search .............. 445/23–25
See application file for complete search history.

(56) References Cited

U.S. PATENT DOCUMENTS

2004/0121602 A1 *    6/2004    Maruyama et al. .......... 438/689

FOREIGN PATENT DOCUMENTS

JP           04091169 A  *  3/1992
JP           A 2004-39542    2/2004

* cited by examiner

*Primary Examiner*—Joseph L Williams
(74) *Attorney, Agent, or Firm*—Oliff & Berridge, PLC (57) ABSTRACT

The preferable method of manufacturing the EL panel comprises a panel precursor formation step of forming a panel precursor including a substrate, a sealing plate disposed facing the substrate, an EL device (EL device portion) provided on a surface of the substrate facing the sealing plate, and a sealant comprising a curable adhesive composition filled between the substrate and the sealing plate; a first curing step of irradiating the sealant with light so as to partially cure the curable adhesive composition; and a second curing step of heating the sealant after the irradiation with the light so as to further cure the curable adhesive composition.

5 Claims, 5 Drawing Sheets

METHOD OF MANUFACTURING EL PANEL INCLUDING TWO CURING STEPS

BACKGROUND OF THE INVENTION

1. Field of the Invention

The present invention relates to a method of manufacturing an EL panel.

2. Related Background of the Invention

EL devices such as organic EL (electroluminescence), inorganic EL or the like are self-emitting light-emitting devices, and are known to have the characteristic features of high brightness and ease of making the device small and light-weight, and hence are promising for application to displays, lighting and so on. However, the light-emitting materials used in such EL devices tend to be prone to degradation due to the outside air (in particular moisture due to humidity etc.), and this has been one factor hindering making such EL devices have a long lifetime. Consequently, hitherto, to reduce contact with the outside air and thus lengthen the lifetime of EL devices, an EL panel form has often been used in which structures constituting the device are sealed between a substrate and a sealing plate.

In recent years, with an aim of further lengthening the lifetime of EL devices, in the case of a panel structured as described above, filling of space between the substrate and the sealing plate with a sealant such as a resin has been carried out. By filling with a sealant in this way, contact of the EL device with the outside air can be further suppressed, whereby degradation of the EL device and so on can be made less prone to occur. Moreover, by covering an EL device with a sealant in this way, the effect of external force on the EL device is reduced, whereby damage of the EL device due to being subjected to external force can be suppressed.

As a method of manufacturing such an EL panel in which the space between the substrate and the sealing plate is filled with a sealant, for example a method is known in which a sealant is applied onto the substrate so as to surround the EL device, then another sealant is dripped onto a region surrounded by above sealant, and the sealing plate is bonded on, and then the sealants are cured by, for example, irradiating with active rays (see Japanese Patent Application Laid-open No. 2004-39542).

SUMMARY OF THE INVENTION

However, with an EL panel obtained using the method described in Japanese Patent Application Laid-open No. 2004-39542, cracking or delamination between the sealing plate and a sealant, between a sealant and the EL device, or between a sealant and the substrate, has been prone to occur when curing the sealants or during used of the device. If cracking or delamination occurs in this way, then deformation arises in the panel and hence it becomes impossible to output the emitted light well, and moreover the EL device may be damaged upon delamination so that light ceases to be omitted altogether. The above problems such as cracking and delamination have been prone to occur in particular with sealants that give a hard cured material such as epoxy resins.

In view of the above state of affairs, it is an object of the present invention to provide a method of manufacturing an EL panel according to which the occurrence of cracking, delamination and so on can be adequately suppressed.

Upon studying the method described in Japanese Patent Application Laid-open No. 2004-39542 in detail, the present inventors discovered that cracking and delamination as described above are caused by stress arising between the sealant and the sealing plate or the EL device due to volumetric shrinkage that occurs accompanying the curing reaction (polymerization reaction) of the sealant. In particular, in the method described above, the sealant is cured in one go up to an almost completely cured state, and hence such volumetric shrinkage occurs abruptly, which is why the above cracking and delamination has been prone to occur. Based on these findings, the present inventors discovered that the occurrence of cracking and delamination can be suppressed and hence an EL panel having excellent light emission characteristics can be obtained by carrying out the curing while relaxing stress arising in the sealant, thus arriving at the present invention.

That is, a method of manufacturing an EL panel of the present invention has a panel precursor formation step of forming a panel precursor comprising a substrate, a sealing plate disposed facing the substrate, an EL device provided on a surface of the substrate facing the sealing plate, and a sealant comprising a curable adhesive composition filled between the substrate and the sealing plate, a first curing step of irradiating the sealant in the panel precursor with active rays so as to partially cure the curable adhesive composition, and a second curing step of heating the sealant after the irradiation with the active rays so as to further cure the curable adhesive composition.

In this way, in the method of manufacturing an EL panel of the present invention, two stages of curing are carried out in which the sealant is first partially cured by irradiating with light and is then further cured by heating. In the partial curing through the irradiation with active rays in the first stage, due to the sealant having adequate flexibility, stress due to volumetric shrinkage accompanying the curing can be adequately relaxed. Then, in the curing through the heating in the subsequently carried out second stage, the curing reaction proceeds gradually, and hence volumetric shrinkage and a decrease in viscosity accompanying the curing proceed gradually. Moreover, little volumetric shrinkage occurs during the production of the second stage cured material from the first stage cured material. Consequently, very little stress arises between the sealant and the sealing plate or the EL device. In this way, in the manufacturing method of the present invention, the amount of stress produced accompanying the curing of the sealant is greatly reduced. Consequently, according to the present invention, there is very little occurrence of cracking, delamination or the like between the sealant and the sealing plate or the EL device during the curing of the sealant or after the EL panel has been completed.

In the above method of manufacturing an EL panel of the present invention, the curable adhesive composition constituting the sealant is preferably delayed photo-curable. Here, "delayed photo-curable" refers to the property that curing by polymerization starts upon irradiation with light, but this polymerization curing reaction is able to continue proceeding even after the irradiation with light has been stopped.

If the curable adhesive composition is delayed photo-curable in this way, then the curing reaction will start upon the irradiation with active rays in the first stage, and further proceed upon the heating in the second stage. In such a two-stage reaction, volumetric shrinkage occurs abruptly during the curing by light in the first stage, but because a flexible cured material is produced, stress is adequately relaxed, and then in the curing by heat in the second stage, the rate of volumetric shrinkage is lower. Consequently, very little stress arises accompanying the curing of the sealant, and as a result the occurrence of cracking and delamination as described above can be reduced.

Moreover, in the above method of manufacturing an EL panel of the present invention, the curable adhesive composition is yet more preferably a delayed photo-curable epoxy resin. Such an epoxy resin is able to exhibit excellent adhesiveness to the substrate, the sealing plate and so on after curing. Consequently, by using such an epoxy resin as the sealant, not only can the occurrence of cracking and delamination as described above can be reduced, but moreover excellent adhesive strength can be obtained between the substrate and the sealing plate. As a result, the EL panel obtained is not prone to being damaged or the like due to delamination of the sealing plate from the substrate or the like, and hence infiltration of moisture through the interface between the sealing plate and the substrate or the like can be reduced, and thus a longer lifetime can be achieved.

More specifically, the curable adhesive composition is preferably one containing at least one main agent selected from the group consisting of bisphenol A type epoxy resins and bisphenol F type epoxy resins, and a polymerization initiator containing at least one anion selected from the group consisting of $SbF_6^-$, $AsF_6^-$, $PF_6^-$, and $BF_4^-$. Such a curable adhesive composition exhibits delayed photo-curing as described above particularly well.

DESCRIPTION OF THE PREFERRED EMBODIMENTS

Following is a description of preferred embodiments of the present invention with reference to the drawings. Note that throughout the drawings, the same elements are designated by the same reference numeral, and redundant repeated description is omitted.

First, a description will be given of one example of the structure of an EL panel obtained using a manufacturing method of the present invention.

Figure 1:
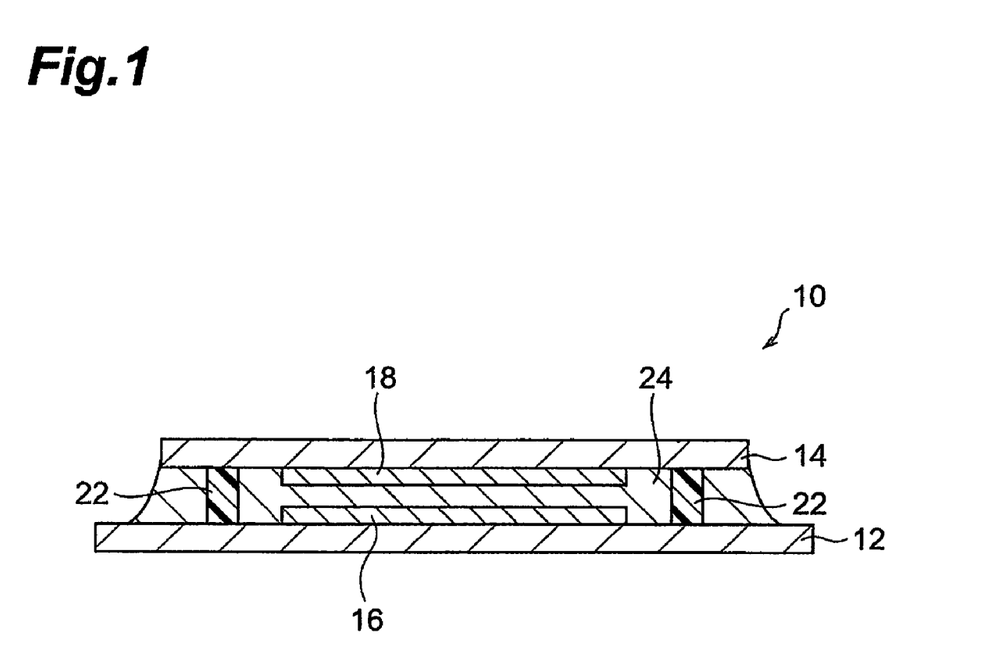
FIG. 1 is a sectional view schematically showing the structure of an EL panel obtained using a manufacturing method according to an embodiment.

FIG. 1 is a sectional view schematically showing the structure of the EL panel obtained using the manufacturing method according to the present embodiment. As shown in FIG. 1, the EL panel 10 has a structure in which a substrate 12 and a sealing plate 14 are bonded together via a sealant layer 24. Moreover, a spacer portion 22 is disposed between the substrate 12 and the sealing plate 14 for maintaining a constant spacing between the substrate 12 and the sealing plate 14. An EL device portion 16 is mounted on a surface of the substrate 12 facing the sealing plate 14. Furthermore, a color filter portion 18 is provided on a surface of the sealing plate 14 facing the substrate 12.

A substrate ordinarily used as an EL device substrate can be used as the substrate 12, for example a glass substrate, a silicon substrate, a film substrate, or an organic substrate such as a resin substrate. Moreover, the sealing plate 14 is, for example, made of a transparent material such as glass so that light emitted from the EL device portion 16 can be outputted to the outside. Furthermore, a color filter portion comprising RGB cells as ordinarily used in liquid crystal panels and the like can be suitably used as the color filter portion 18. Note that in the case of using the EL panel 10 as lighting or the like, it is not necessary to include the color filter portion 18.

The sealant layer 24 is formed so as to fill the space between the substrate 12 and the sealing plate 14, excluding regions occupied by the EL device portion 16, the color filter portion 18 and the spacer portion 22. The sealant layer 24 is constituted from a cured material of a curable adhesive composition. The curable adhesive composition is at least photocurable, and is preferably also heat-curable. Of such curable adhesive compositions, a delayed photo-curable adhesive composition is preferable. This delayed photo-curable adhesive composition will be described later.

Although not shown in FIG. 1, the plural spacer portion 22 is disposed around the perimeter of the EL device portion 16 so as to surround the EL device portion 16. That is, the spacer portions 22 are dotted around the perimeter of the EL device portion 16. The spacers contact and thus support both the substrate 12 and the sealing plate 14, thus maintaining a constant spacing between the substrate 12 and the sealing plate 14. Glass particles, silica particles, resin particles, metal particles or the like can be used as the spacer portion 22.

To maintain the constant spacing between the substrate 12 and the sealing plate 14, the spacer portion 22 preferably have a sufficient rigidity such as not to deform under application of a moderate pressure. Meanwhile, to reduce the occurrence of a gap or the like between the spacer portion 22 and the sealant layer 24, the spacer portion 22 preferably has good affinity to the sealant From these viewpoints, the spacer portion 22 preferably has a structure in which a rigid core material (e.g. glass particles, silica particles, etc.) is dispersed in a flexible material (e.g. a resin).

The plurality of spacer portions 22 around the perimeter of the EL device portion 16 may have point-like form. For example, the spacer portion 22 may be constructed such as to be provided in a ring shape surrounding the EL device portion 16. In this case, the spacer portion 22 may, for example, have a structure in which a core material as described above is dispersed in a resin provided in a ring shape around the perimeter of the EL device portion 16.

Figure 2:
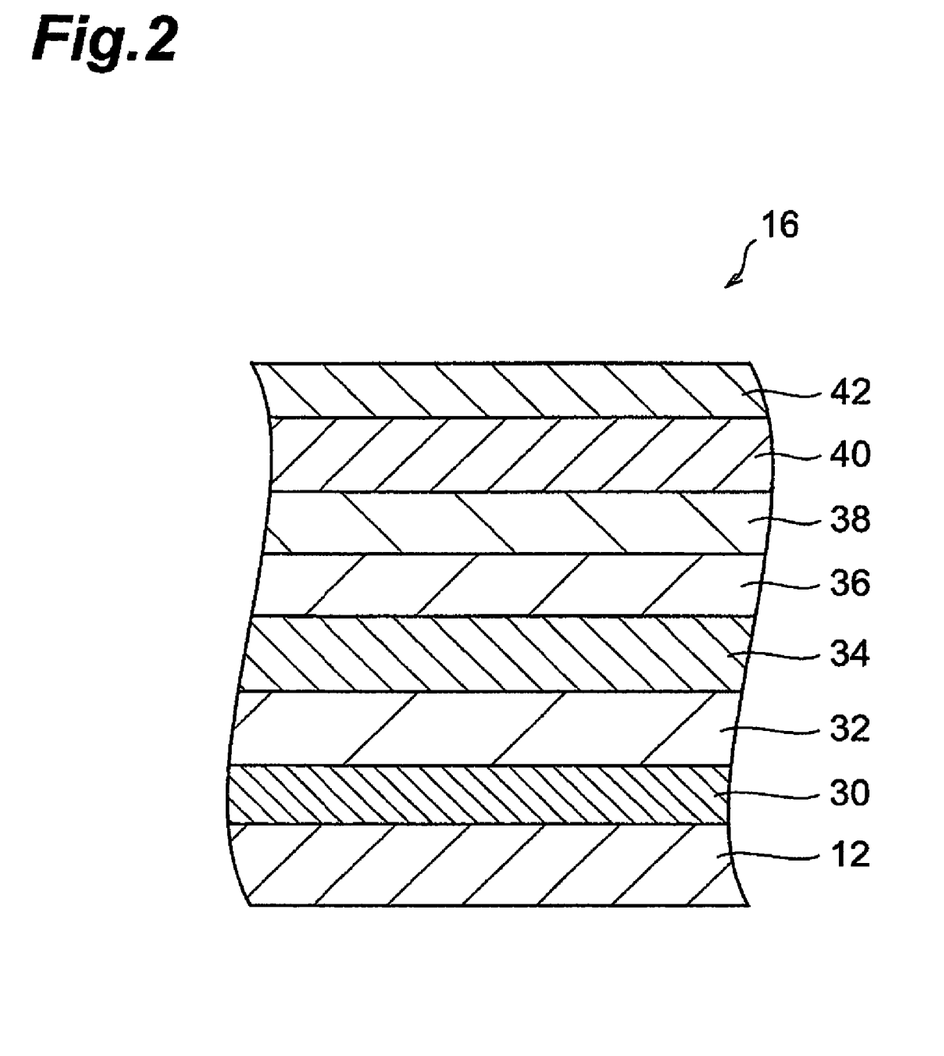
FIG. 2 is a sectional view schematically showing the structure of main parts of an EL device portion.

The EL device portion 16 mounted on the EL panel 10 will now be described with reference to FIG. 2. Note that here, the case of an example in which an organic EL device is formed as the EL device portion 16 is described. FIG. 2 is a sectional view schematically showing the structure of main parts of the EL device portion 16.

The EL device portion 16 comprises an anode 30, a hole injection layer 32, a hole transport layer 34, a light-emitting layer 36, an electron transport layer 38, an electron injection layer 40, and a cathode 42 formed in this order on the substrate 12. The EL device portion 16 is a so-called top emission type organic EL device in which the light emitted from the light-emitting layer 36 is outputted from an end face on the opposite side to the substrate 12.

In the EL device portion 16, the anode 30 can be made to be a transparent electrode made of ITO (indium tin oxide) or the like, or a reflecting electrode made of metal or the like, but from the viewpoint of outputting the light efficiently, is preferably made to be the latter, i.e. a reflecting electrode. On the other hand, to output the light from the light-emitting layer 36, the cathode 42 is preferably made to be a transparent electrode made of ITO or the like.

The hole injection layer 32, the hole transport layer 34, the electron transport layer 38 and the electron injection layer 40 may be made of publicly known materials used for these purposes in organic EL. Moreover, the light-emitting layer 36 may be made of either a low molecular weight type or a macromolecular type light-emitting material. Note that the light-emitting layer 36 may also be doped with a desired organic material or the like.

The organic EL panel 10 is not limited to the form described above in which the light is outputted from the sealing plate 14 side, but rather, for example, the substrate 12 may be constituted from a transparent material, and the light may be outputted from the substrate 12 side. Such an EL device portion 16 constitutes a so-called bottom emission type organic EL device. In this case, there is no need to provide the color filter portion 18 on the sealing plate 14 side, but rather it is preferable to dispose the color filter portion 18 in a freely chosen position on the substrate 12 side.

Next, a method of manufacturing the EL panel according to a preferred embodiment will be described.

Figure 3:
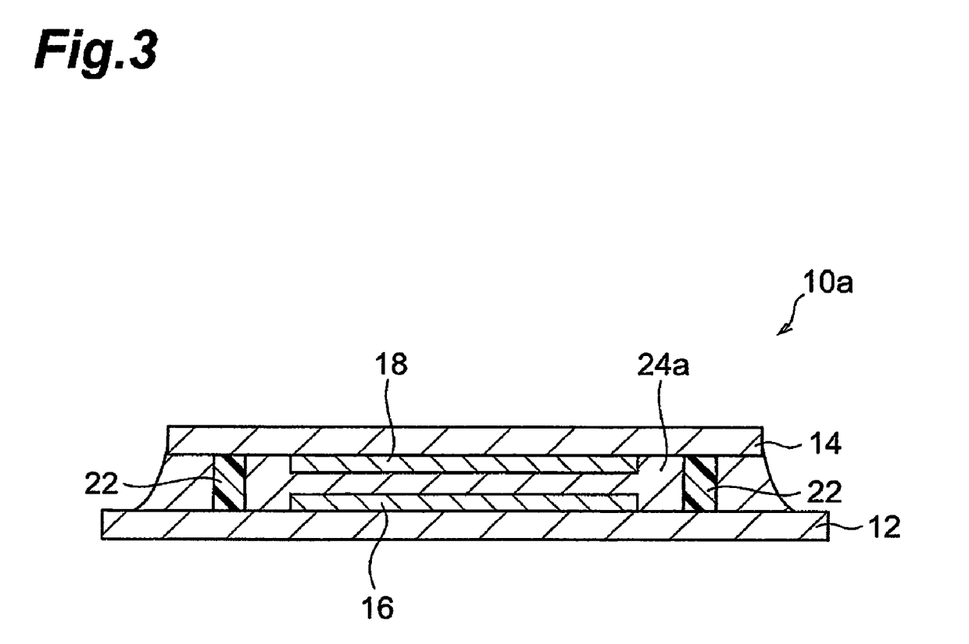
FIG. 3 is a sectional view schematically showing the structure of a panel precursor.

In the method of manufacturing the EL panel 10 having the above structure, first, a panel precursor 10a as shown in FIG. 3 is formed (panel precursor formation step). FIG. 3 is a sectional view schematically showing the structure of the panel precursor 10a. In the manufacture of the panel precursor 10a, first, the substrate 12 is prepared, and the various layers constituting the EL device portion 16 as described above are built up on the substrate 12. The method of forming each layer may be freely chosen, for example in the case of forming a layer made of an inorganic material or a low molecular weight organic material, a vapor deposition method may be used, whereas in the case of forming a layer made of a macromolecular organic material, a publicly known coating method or printing method may be used.

Next, a plurality of particulate spacers portions 22 are dotted around the perimeter of the EL device portion 16 or a ring-shaped spacer portion 22 is formed by applying a core material-containing resin in a ring shape around the perimeter of the EL device portion 16. A sealant 24a that will form the sealant layer 24 after curing is then dripped in on the inside of the spacer portion 22. The amount added of the sealant 24a is made to be such that when bonding on the sealing plate 14 as described below, at least the region surrounded by the spacer portion 22 between the substrate 12 and the sealing plate 14 can be filled up by the sealant 24a.

As described earlier, the sealant 24a is an adhesive composition that is at least photo-curable, and is preferably a delayed photo-curable adhesive composition. This delayed photo-curable adhesive composition is an adhesive composition having the property of starting to polymerize upon being irradiated with light, but then staying in a rubber-like state for a while, before gradually hardening.

As the delayed photo-curable adhesive composition, a photo (in particular UV) cationic curing type adhesive composition is preferable, and of such adhesive compositions, a UV cationic curing type epoxy resin is preferable. An example of such a UV cationic curing type epoxy resin is an epoxy resin composition having as main components thereof a liquid epoxy resin and a photo cationic polymerization initiator. A specific example is one containing a bisphenol A type epoxy resin or a bisphenol F type epoxy resin as a main agent, and a polymerization initiator containing the anion $SbF_6^-$, $AsF_6^-$, $PF_6^-$, or $BF_4^-$. An example of the polymerization initiator is one in which a salt is formed from one of the above four anions and, for example, a counter ion represented by the following chemical formula (1a) or (1b). Of these, a trisarylsulfonium hexafluoroantimonate is preferable.

In the manufacture of the panel precursor 10a, a structure comprising the substrate 12, the EL device portion 16, the spacer portion 22 and the sealant 24a as described above is formed, and the sealing plate 14 having the color filter portion 18 provided thereon is further prepared. An example of the method of forming the color filter portion 18 on the sealing plate 14 is a method in which filters of the colors R, G and B are formed in order on the sealing plate 14 using a photolithography method or the like.

After that, the above-mentioned structure, and the sealing plate 14 having the color filter portion 18 provided thereon are bonded together, thus obtaining the panel precursor 10a. In the bonding, first the sealing plate 14 is disposed on the structure such that the EL device portion 16 and the color filter portion 18 face one another. The substrate 12 and the sealing plate 14 then have pressure applied thereto from the outside thereof. At this time, heating may be carried out together with the application of pressure.

In the manufacture of the EL panel 10, after the panel precursor 10a has been manufactured in this way, the sealant 24a in the panel precursor 10a is irradiated with light, thus bringing about a polymerization reaction of the curable adhesive composition constituting the sealant 24a, whereby the composition is partially cured (first curing step).

Here "partially cured" means that the curable adhesive composition is not completely hardened, but rather maintains a certain degree of fluidity. The extent of to which the curable adhesive composition is cured can be measured, for example, using a differential scanning calorimeter (DSC). Note that in the first curing step, it is preferable to cure the sealant 24a to an extent such as to maintain a rubber-like state. Moreover, in the case of using a curable resin material containing a core material as the spacer portion 22, the curing of the spacer portion 22 may be carried out simultaneously in this first curing step.

There are no particular limitations on the light irradiated onto the sealant 24a, so long as this is light able to bring about the curing of the curable adhesive composition. For example, in the case that the curable adhesive composition is one that undergoes curing upon irradiation with UV light, UV light can be used. As the UV light, for example light emitted from a high-pressure mercury lamp can be used.

The partial curing of the curable adhesive composition can be brought about by making conditions such as the amount of light irradiated onto the sealant 24a and the irradiation time be such that complete curing of the curable adhesive composition does not occur. Specifically, examples are a method in which light emitted from a light source ordinarily used in the curing of a photo-curable resin is irradiated onto the sealant 24a after having been attenuated by being passed through a filter or the like, or a method in which the light from such a light source is irradiated for a shorter time than conventionally. In the case of using a light source for which the light output can be adjusted, it is preferable to irradiate with light whose output has been adjusted in advance to be suitable for the partial curing.

In the case in particular that the panel precursor 10a has a transparent sealing plate 14 having the color filter portion 18 thereon as in the present embodiment, a conventional light source as described above may be disposed on the sealing plate 14 side, whereby the light emitted from the light source is attenuated by the color filter portion 18, becoming light suitable for the partial curing as described above.

Next, after the irradiation with the light, the sealant 24a is heated, thus causing the polymerization reaction of the curable adhesive composition that has been partially cured to proceed further, whereby the composition is cured beyond the partially cured state, so as to form the sealant layer 24 (second curing step). The EL panel 10 having the structure described earlier is thus obtained. Note that during the second curing step, the irradiation with the light may be continued, or may be stopped.

In the second curing step, the polymerization reaction that the curable adhesive composition has undergone through the irradiation with light described above proceeds further through the heating. For example, in the case that a UV cationic curing type epoxy resin is used as the curable adhesive composition, the cationic polymerization that has taken place in the first curing step proceeds as a chain reaction through the heating in the second curing step.

In the second curing step, the curable adhesive composition that had been partially cured is substantially completely cured. As a result, the substrate 12 and the sealing plate 14 are bonded together strongly, and moreover the EL device portion 16 becomes surrounded by the sealant layer 24, and hence damage of the EL device portion 16 due to external force or the like can be suppressed.

As described above, in the method of manufacturing the EL panel 10 of the present embodiment, two stages of curing including the first curing step and the second curing step are carried out. In the first curing step, the curable adhesive composition constituting the sealant 24a is partially cured through a polymerization reaction brought about by irradiation with light. In this partial curing, the sealant 24a undergoes volumetric shrinkage accompanying the polymerization, but due to having a certain degree of flexibility (preferably being rubber-like), stress arising between the sealant 24a, and the substrate 12, sealing plate 14 or EL device portion 16 contacting the sealant 24a can be adequately relaxed.

Next, in the second curing step, the sealant 24a that has been partially cured is heated, whereby the polymerization reaction of the curable adhesive composition further proceeds, and hence the sealant 24a is further cured. In this step, volumetric shrinkage arises accompanying the polymerization, but does not proceed as abruptly as in the photo-polymerization, and hence very little stress arises between the sealant 24a and the substrate 12 and so on.

With a conventional curing method, the curable composition (resin etc.) constituting the sealant is cured all in one go by irradiating with light or heating, and hence the above-mentioned volumetric shrinkage occurs abruptly, and thus there has been a tendency for very much stress to arise between the sealant and the substrate and so on. Cracking and delamination has thus been very prone to occur between the sealant and the substrate and so on. In contrast with this, according to the method of manufacturing the EL panel 10 of the present embodiment, the amount of stress produced can be greatly reduced as described above, and hence such cracking and delamination becomes very unprone to occur. As a result, the EL panel 10 obtained has little deformation or damage of the EL device portion 16 due to such cracking or delamination, and hence good light emission is obtained, and moreover a long lifetime can be achieved.

Note that the method of manufacturing an EL panel of the present invention and the EL panel obtained through the method are not limited to those described in the above embodiment, but rather various modifications are possible.

For example, in the above embodiment, the filling with the sealant 24a was carried out by dripping the sealant 24a onto the substrate 12 on which the EL device portion 16 has been provided, and then bonding on the sealing plate 14; however, there is no limitation thereto, but rather, for example, the sealant 24a may be coated onto a prescribed region of the substrate 12, or the sealant 24a may be injected in between the substrate 12 and the sealing plate 14 after the substrate 12 and the sealing plate 14 have been bonded together via the spacer portion 22.

Moreover, the spacer portion 22 may be disposed on the substrate 12 not before, but rather after, dripping on the sealant 24a. Alternatively, the spacer portion 22 may be provided in a prescribed position on the sealing plate 14 in advance, and then bonded to the substrate 12, thus disposing the spacer portion 22 between the substrate 12 and the sealing plate 14. Furthermore, in the case that a sufficient spacing can be maintained between the substrate 12 and the sealing plate 14 purely through the rigidity of the sealant layer 24, the spacer portion 22 need not be used.

Furthermore, for the sealant 24a, so long as at least the two stages of curing described above, namely photo-curing and heat-curing, are carried out, more stages of curing than this may be used. For example, in the first curing step, multi-stage curing may be carried out with the amount of light irradiated being varied, and in the second curing step, multi-stage heating may be carried out.

EXAMPLE

Following is a more detailed description of the present invention through Examples; however, the present invention is not limited to these Examples.

Example 1

First, an organic EL device in which an EL device portion was provided on a substrate was formed. Next, a spacer portion comprising a resin was disposed around the perimeter of the EL device portion on the substrate, and then a UV cationic curing type epoxy resin (XNR5570, made by Nagase Chemtex Corporation) was dripped as a sealant onto the region surrounded by the spacer. A transparent sealing plate having a color filter portion provided thereon was then disposed on the substrate such that the EL device portion and the color filter portion faced one another, and the substrate and the sealing plate were bonded together by applying pressure thereto, whereby a panel precursor was obtained.

After that, the panel precursor obtained was irradiated from the sealing plate side with UV light (output 13,000 mJ/cm$^2$) emitted from a high-pressure mercury lamp. The sealant was thus irradiated with UV light attenuated by the color filter portion. The UV cationic curing type epoxy resin was somewhat cured after the irradiation with the UV light, but was still flexible, having a low elastic modulus.

After that, the panel precursor was heated for 1 hour at 80° C., thus further curing the UV cationic curing type epoxy resin constituting the sealant, whereby an EL panel was obtained. Through the heating, the sealant was substantially completely cured, becoming non-fluid.

The EL panel was examined during and after the above manufacture, whereupon it was found that cracking or delamination did not occur between the sealant, and the substrate, the sealing plate or the EL device portion. Moreover, the EL panel obtained was made to emit light, whereupon it was found that good light emission could be obtained, with no deformation or unlit parts.

Comparative Example 1

An EL panel was manufactured as in Example 1, except that the color filter portion was not provided.

Upon examining the EL panel obtained, it was found that delamination had occurred between the sealing plate and the sealant. Moreover, upon trying to make the EL panel emit light, light was not obtained.

(Measurement of Viscoelasticity of Sealant)

For reference, the viscoelasticity of the UV cationic curing type epoxy resin used as the sealant (XNR5570, made by Nagase Chemtex Corporation) was measured.

Figure 4:
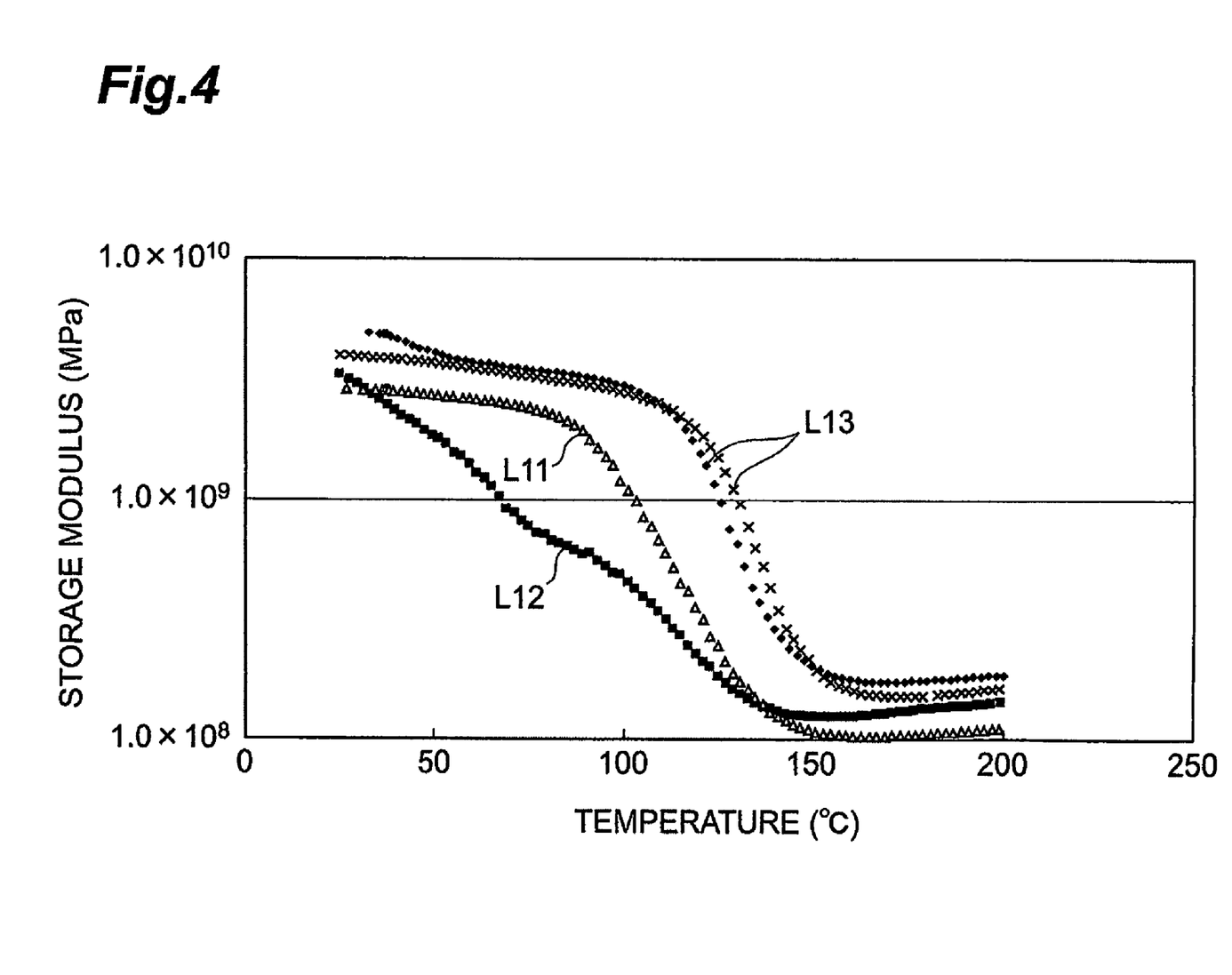
FIG. 4 is a graph showing the storage modulus of cured materials obtained by curing a UV cationic curing type epoxy resin under various conditions.
Figure 5:
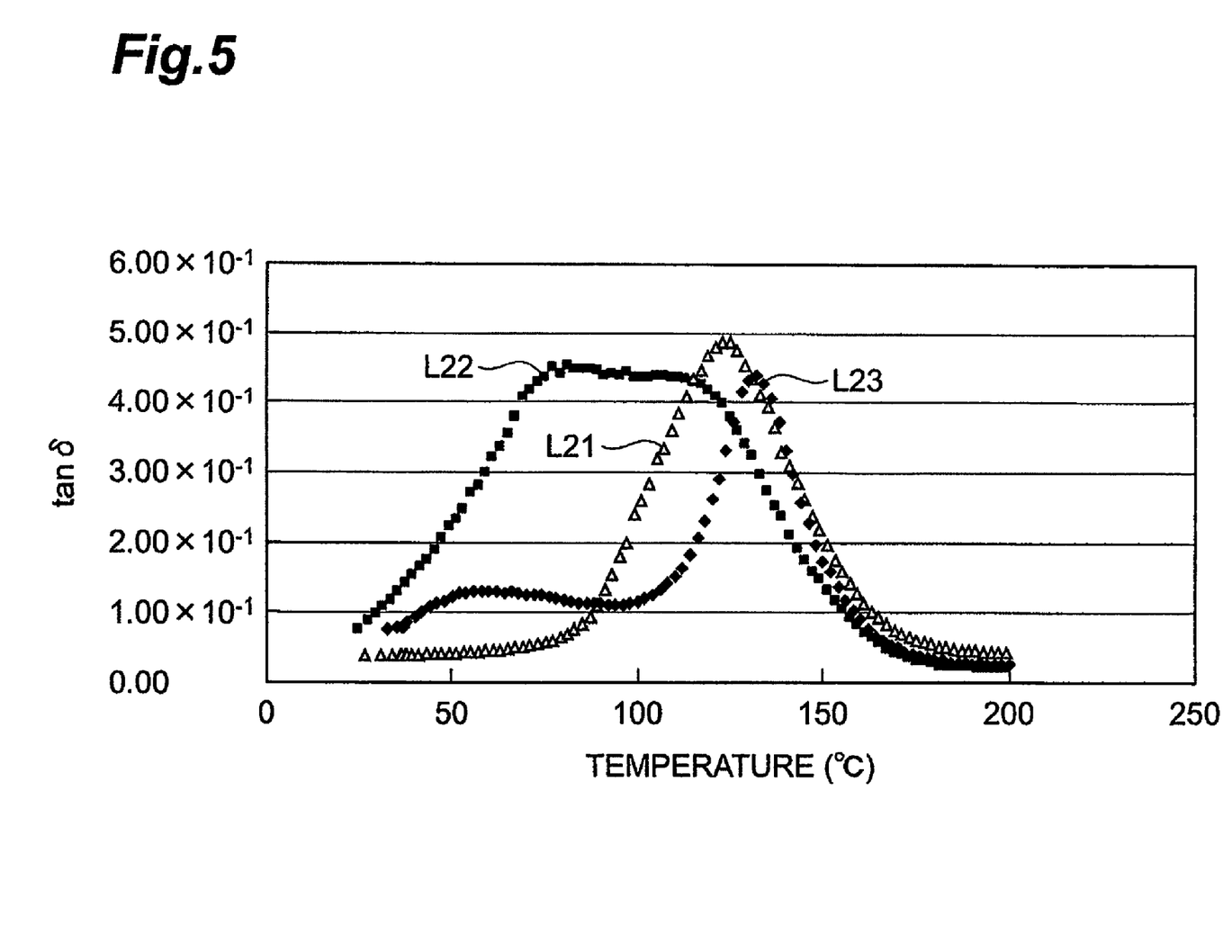
FIG. 5 is a graph showing the loss tangent (tan δ) of the cured materials obtained by curing the UV cationic curing type epoxy resin under the various conditions.

Specifically, the UV cationic curing type epoxy resin was treated under the following three sets of conditions: (1) irradiation with 13,000 mJ/cm$^2$ of UV light was carried out via a color filter portion, and then heating was carried out for 1 hour at 80° C.; (2) irradiation with 13,000 mJ/cm$^2$ of UV light was carried out via a color filter portion; and (3) irradiation with 13,000 mJ/cm$^2$ of UV light was carried out not via a color filter portion;

After that, for each of the cured materials obtained, viscoelasticity measurement was carried out using a dynamic viscoelasticity measuring apparatus. The values of the storage modulus, and the loss tangent (tan δ) calculated from the storage modulus, for each of the cured materials obtained from the measurement are shown in FIGS. 4 and 5. In FIG. 4, L11 shows the results for the cured material obtained under conditions 1, L12 shows the results for the cured material obtained under conditions 2, and L13 shows the results for the cured material obtained under conditions 3 (measurement carried out twice). Similarly, in FIG. 5, L21 shows the results for the cured material obtained under conditions 1, L22 shows the results for the cured material obtained under conditions 2, and L23 shows the results for the cured material obtained under conditions 3.

It can be seen from FIGS. 4 and 5 that the stress relaxation capability is better for the cured material obtained under conditions 1 than for the cured materials obtained under the other conditions. Specifically, first, from FIG. 4, the storage modulus at 80° C., which is the curing temperature in the second curing stage, is lower for the cured material obtained under conditions 1 (L11) than the cured material obtained under conditions 3 (L13), indicating a more flexible state. Moreover, from FIG. 5, the tan δ spread is over a broader temperature region for the cured material obtained under conditions 1 (L21) than the cured material obtained under conditions 3 (L23), showing that the stress relaxation capability is better. Moreover, when curing using conditions 1, a cured material the same as that obtained under conditions 2 is first produced through the curing reaction caused by the irradiation with UV light. Here, it can be seen that for the cured material obtained under conditions 2 (L22), a high value of tan δ is maintained over a broad temperature range, indicating that relaxation of stress is excellent over a broad temperature range. It can thus be seen from these results that there is little stress in the cured material obtained through the irradiation with UV light under conditions 1, and moreover absorption of stress accompanying shrinkage up to the completely cured material produced through the subsequent heating is excellent.

According to the present invention, there can be provided a method of manufacturing an EL panel according to which the occurrence of cracking, delamination and so on can be adequately suppressed.

What is claimed is:

1. A method of manufacturing an EL panel, comprising:
   a panel precursor formation step of forming a panel precursor comprising a substrate, a sealing plate disposed facing said substrate, an EL device provided on a surface of said substrate facing said sealing plate, and a sealant comprising a curable adhesive composition filled between said substrate and said sealing plate;
   a first curing step of irradiating said sealant with light so as to partially cure said curable adhesive composition; and
   a second curing step of heating said sealant after the irradiation with the light so as to further cure said curable adhesive composition, which is performed following the first curing step.

2. The method of manufacturing an EL panel according to claim 1, wherein said curable adhesive composition is delayed photo-curable.

3. The method of manufacturing an EL panel according to claim 1, wherein said curable adhesive composition is a delayed photo-curable epoxy resin.

4. The method of manufacturing an EL panel according to any one of claim 1, wherein said curable adhesive composition contains at least one main agent selected from the group consisting of bisphenol A type epoxy resins and bisphenol F type epoxy resins, and a polymerization initiator containing at least one anion selected from the group consisting of $SbF_6^-$, $AsF_6^-$, $PF_6^-$, and $BF_4^-$.

5. The method of manufacturing an EL panel according to claim 1, wherein said sealant is irradiated from said sealing plate side with light in the first curing step.

* * * * *